(12) United States Patent
De Caria (10) Patent No.: US 10,773,540 B2
(45) Date of Patent: Sep. 15, 2020

(54) UNIT FOR WASHING FLEXOGRAPHIC PLATES

(71) Applicant: Sasu Vianord Engineering, Carros (FR)

(72) Inventor: Riccardo De Caria, Basiglio (IT)

(73) Assignee: SASU VIANORD ENGINEERING, Carros (FR)

( * ) Notice: Subject to any disclaimer, the term of this patent is extended or adjusted under 35 U.S.C. 154(b) by 214 days.

(21) Appl. No.: 16/140,177

(22) Filed: Sep. 24, 2018

(65) Prior Publication Data

US 2019/0092069 A1    Mar. 28, 2019

(51) Int. Cl.
*B41N 3/00* (2006.01)
*B41F 35/00* (2006.01)
*B65G 49/04* (2006.01)
*G03F 7/30* (2006.01)

(52) U.S. Cl.
CPC ............. *B41N 3/006* (2013.01); *B41F 35/00* (2013.01); *B65G 49/0413* (2013.01); *G03F 7/3035* (2013.01); *B41P 2235/23* (2013.01)

(58) Field of Classification Search
None
See application file for complete search history.

(56) References Cited

U.S. PATENT DOCUMENTS

| 3,309,993 | A | * | 3/1967 | Grembecki | B41F 35/00 101/425 |
| 5,067,193 | A | * | 11/1991 | Thomas | B41F 35/001 134/10 |
| 2013/0042773 | A1 | * | 2/2013 | Kumagai | B41F 9/1018 101/167 |

FOREIGN PATENT DOCUMENTS

| DE | 102010029018 | 11/2011 |
| EP | 1852257 | 7/2007 |
| FR | 2543886 | 10/1984 |

\* cited by examiner

*Primary Examiner* — Jill E Culler
(74) *Attorney, Agent, or Firm* — Stetina Brunda Garred and Brucker (57) ABSTRACT

The present invention relates to a water-based or solvent-based washing unit for washing a flexographic plate. The washing unit comprises a containment structure which defines a lower basin and at least two side basins which are supplied with the washing liquid and are arranged so that the water overflowing from the side basins is collected in the lower basin. A brush partially immersed in the liquid bath defined by the basin itself is installed at each basin.

15 Claims, 7 Drawing Sheets

UNIT FOR WASHING FLEXOGRAPHIC PLATES

CROSS REFERENCE TO RELATED APPLICATION(S)

The present application claims priority to European Patent Application No. 17192885.6 filed Sep. 25, 2017, the entirety of the disclosures of which are expressly incorporated herein by reference.

STATEMENT RE: FEDERALLY SPONSORED RESEARCH/DEVELOPMENT

Not Applicable.

FIELD OF THE INVENTION

The present invention falls within the field of manufacturing plants for preparing digital print plates for flexography. In particular, the present invention relates to a washing unit of a flexographic plate comprising said treatment unit.

BACKGROUND ART

Flexography is a direct rotary press method which uses relief plates made with photopolymeric materials. The plates are flexible and soft, and hence the name flexography. Such plates are inked and the print is obtained by means of directly depositing the ink on the support to be printed due to a slight pressure exerted by a printing cylinder on which the plates are positioned.

Flexography is a high speed printing process capable of printing on many types of absorbent and non-absorbent materials. Certain typical applications of flexographic printing are the making of paper and plastic bags, milk cartons, disposable cups, and the like, however by virtue of the progress today in print quality, flexographic printing is also used to print newspapers, for example, as well as bags, labels, and print on plastic, acetate film and sheets, parcel paper and for many materials used in packaging products.

A particular flexographic printing process is "digital flexography", in which the use of digital plates is provided. The photo-polymer in such plates in origin is covered by a surface layer of material which does not allow photo-exposure, such as for example a layer of carbon or graphite. Such a layer of material is etched so as to create the negative image of the print subject. Such an etching step typically is performed through a digital laser controlled by a computer (hence the acronym CTP "computer to plate" with which the field indicates this step of the pre-printing process). The plate is then photoexposed and the material not exposed to light is eliminated by means of a washing operation actuated at a washing unit.

In particular, the washing of the plate typically is performed with solvent-based liquid which dissolves the polymer or the monomer. Alternatively, the washing liquid may be water-based. In any case, there is provided the mechanical action of brushes which act on the surface of the plate to promote the detachment of the monomer or of the polymer previously not exposed to the light.

Washing with solvent-based liquid is more common with respect to washing with water-based liquid, despite the use of solvent has various drawbacks, among which the release of volatile organic compounds (VOC), disposal difficulties and, more generally, the impact in terms of environmental safety are reported. Although water-based washing does not have these drawbacks, it requires a stronger mechanical action because unlike the solvent, water does not dissolve the polymer but only softens it. This results in an increased number of brushes and a more complicated water network for bringing the washing liquid at the brushes. In addition to this, the liquid volumes are also greater.

Typically, to wash flat plates, washing units are used provided with a chamber, inside of which there is defined a movement plane along which the plate is caused to advance. The washing brushes act on the surface of the plate opposite to the one resting on the movement plane. There are hydraulic terminals positioned in the chamber which bring the liquid at the washing brushes. In the case of water-based washing, the size of said unit become significant precisely for the above-indicated reasons, i.e. the need to have many brushes and accordingly the need for an extensive water network.

Operating stations are known for washing "sleeve" type flexographic plates, i.e. plates which are mounted on a support cylinder before undergoing the photo-exposure step. Such a cylinder carries a plate for the whole forming process thereof and is positioned in a chamber. Two washing brushes typically are installed in the latter, which brushes rotate with respect to an axis parallel to the one of the support cylinder. The washing of the "sleeve" plates occurs when solvent-based liquid is released above them by means of a water network. To this end, it has been noted that this delivery of liquid above the brushes does not allow a homogeneous bathing of the surface of the plate, while affecting the volume of liquid required and the size of the water network used.

It has been found that the stations for washing "sleeve" type plates have more contained size with respect to the ones traditionally used for washing flat plates. Moreover, also the washing times are more contained for the sleeve type plates with respect to flat plates. Therefore, the washing of a plate mounted beforehand on a support cylinder has potential advantages with respect to the washing thereof on a movement plane.

However, washing stations of sleeve type plates currently known are not operatively versatile. In particular, they do not lend themselves to washing with water-based liquid which as noted above, requires an increased number of brushes. In particular, it has been noted how in current washing machines dedicated to "sleeve" plates, the water network and the system for delivering the liquid in the chamber are entirely unsuitable for water-based washing.

Therefore, in light of the abovementioned considerations, it is the main task of the present invention to provide a washing unit of flexographic plates which allows the above-indicated drawbacks to be overcome. Within the scope of this task, it is a first object to provide a washing unit which may be used for solvent-based or water-based washing. It is another object to provide a washing unit which allows a homogeneous delivery of the liquid to the brushes and therefore a quicker and more effective washing. It is a further object of the present invention to provide a washing unit which allows a washing speed which is equal to or less than the etching speed of the plate. Not last, it is an object to provide a treatment unit which is reliable and easy to make at competitive costs.

SUMMARY

The present invention therefore relates to a water-based or solvent-based washing unit for washing a flexographic plate according to claim 1. According to a first aspect, the washing unit comprises a containment structure which defines a lower basin and at least two side basins which are supplied with the washing liquid and are arranged so that the water overflowing from the side basins is collected in the lower basin. A brush partially immersed in the liquid bath defined by the basin itself is installed at each basin. Advantageously, during the rotation thereof, the brushes are continuously bathed by the basin below, thus promoting a more homogeneous delivery in the brushes themselves and accordingly, on the surface of the plate. This results in more effective washing.

At the same time, the lower basin is constantly supplied with liquid from the side basins. This solution advantageously simplifies the water supply network which is configured only to supply the side basins.

LIST OF THE DRAWINGS

Further features and advantages of the present invention will become more apparent from the following detailed description, provided by way of non-limiting example and illustrated in the accompanying drawings, in which.

The same numbers and the same reference letters in the figures identify the same elements or components.

DETAILED DESCRIPTION

With reference to the mentioned drawings, the present invention therefore relates to a washing unit 100 for washing a flexographic plate 52. In particular, such a washing may be implemented using a water-based liquid, or alternatively a solvent-based washing liquid. Thus, the use of the washing unit 100 does not depend on the type of liquid used.

The washing unit 100 according to the invention comprises a chamber 55 inside of which the washing of plate 52 occurs. A main cylinder 1 rotating about the longitudinal axis 500 thereof is arranged in such a chamber 55. Preferably, the main cylinder 500 rotates in both possible directions of rotation. A plate 52 to be washed is arranged/wound about the main cylinder 1. In substance, plate 52 adheres against the outer surface of the main cylinder 1.

In this regard, the flexographic plate 52 may be of the "sleeve" type and therefore already wound about the support cylinder also in the etching step and in the exposure step, which precede the washing step. In this hypothesis, the support cylinder may be positioned in chamber 55 and will form the above-defined main cylinder 1. Alternatively, plate 52 may be "flat". In this second case, the washing unit 100 preferably will be provided with an operating assembly 95 dedicated to loading/unloading the flat plate 52 onto/from the main cylinder 1. A possible embodiment of the operating assembly 95 is described below with reference to FIGS. 8 to 13.

The washing unit 100 comprises at least one assembly of washing brushes 6, 6A, each of which may rotate about a rotation axis 600 parallel to the longitudinal axis 500 of the main cylinder 1. Each of brushes 6, 6A, 6B has a length, measured along the rotation axis 600, which is greater than or equal to the one of the main cylinder 1 to ensure a complete brushing of the plate. Preferably, adjacent brushes 6, 6A, 6B of the brush assembly rotate according to discordant directions.

The washing unit 100 according to the invention comprises a water supply network 80 for bringing the washing liquid into chamber 55. The water network 80 can be connected to a tank 60 containing the washing liquid. Preferably, such a tank 60 is provided in a position below chamber 55. However, tank 60 could also be connected in a more remote position. Preferably, there is provided at least one pump 15 for circulating the liquid in the water supply network.

In general, for the purposes of the present invention, the expression "water network 80" is intended to generically indicate the assembly of hydraulic components which allow the washing liquid to be conveyed from tank 60 to a plurality of hydraulic terminals 81 in chamber 55 through which ends the liquid itself may exit.

According to the invention, the washing unit 100 comprises a containment structure 40 for the collection and delivery of the liquid in chamber 55. In particular, such a structure 40 serves the function of collecting and conveying the washing liquid, which is introduced into chamber 55 through the water network 80. According to the invention, such a structure 40 comprises at least one liquid collection lower basin 51 arranged in a position below the main cylinder 1. The lower basin 51 also defines a discharge section 51A through which the liquid may return into tank 60, directly or through hydraulic pipes. In this regard, the liquid may fall directly by gravity into tank 60 or alternatively may be indirectly guided into tank 60 through specific pipes and/or channels.

According to the invention, structure 40 comprises at least a first side supply basin 52A and a second side supply basin 52B, which are positioned on the opposite sides with respect to a first vertical reference plane R1 containing the longitudinal axis 500. Each of the two side basins 52A, 52B is called "supply" basin because it is "supplied" with washing liquid through the water network 80.

According to the invention, the side basins 52A, 52B are arranged with respect to the lower basin 51 so that following the filling thereof, the washing liquid overflows, directly or indirectly spilling into the lower basin 51.

In particular, following the overflowing of the side basins 52A, 52B, the liquid may flow "directly", in that it may fall directly into the lower basin 51. Alternatively, following the outlet from the side basins 52A, 52B, the liquid may be collected in an intermediate basin to then overflow therefrom and be conveyed into a lower basin 51, according to one embodiment shown in FIGS. 4 to 7 and better described below.

Again according to the invention, at least one washing brush 6, 6A, 6B is installed at each of the basins 51, 52A, 52B so that the brush remains partially immersed in the bath of liquid collected in the basin itself. Following the rotation thereof, each rotating brush 6, 6A, 6B may capture liquid in the corresponding basin 51, 52A, 52B, thus bringing the liquid in contact with the flexographic plate 52 in the region in which the brush itself acts. Advantageously, each brush is bathed from the bottom by the liquid. As a result of the rotation thereof, such a liquid is uniformly delivered in the brushes and accordingly, in a homogeneous manner on the surface of the plate on which the bristles of the brushes themselves act.

Figure 1:
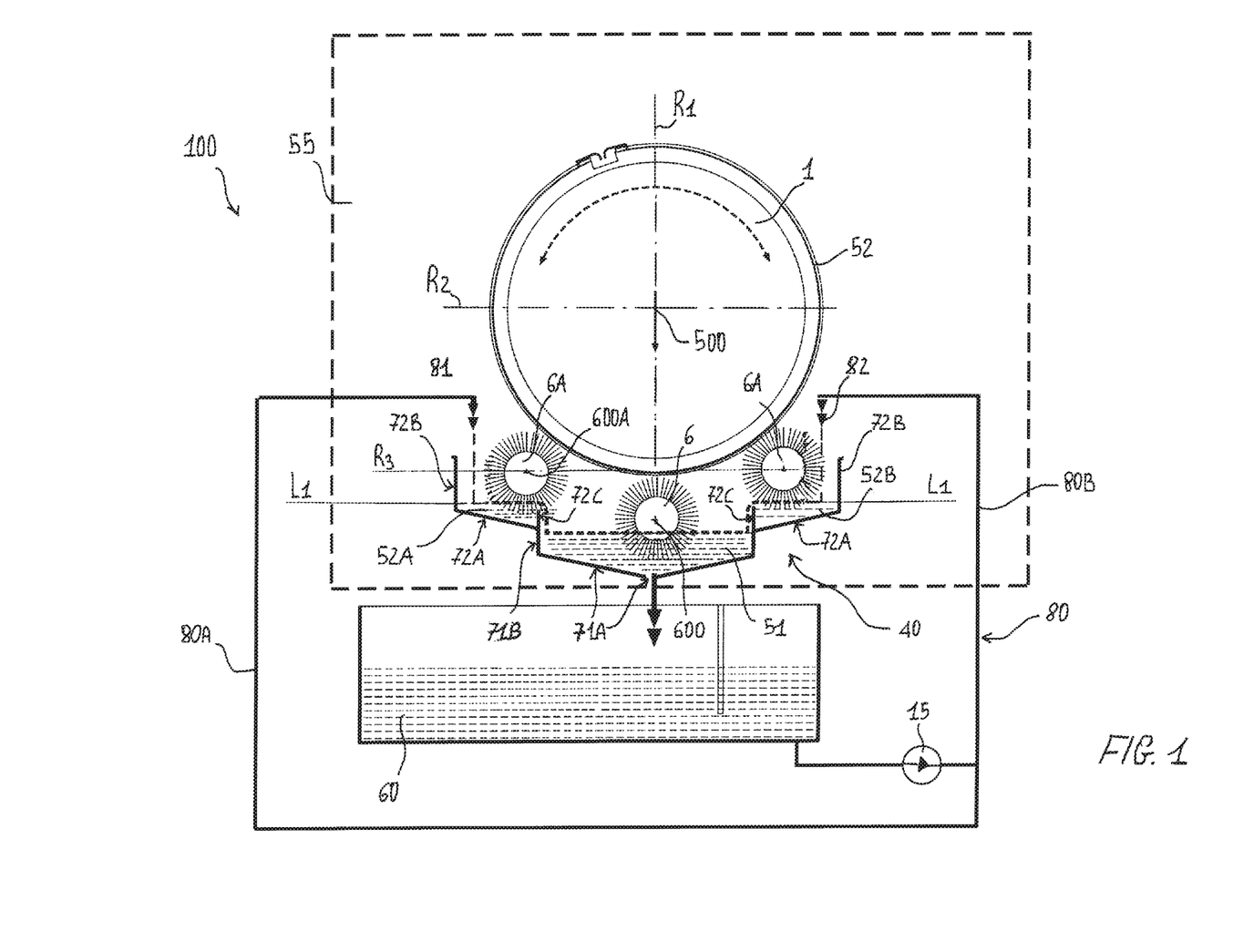
FIG. 1 is a schematic view of a first embodiment of a washing unit according to the present invention.

FIG. 1 is a schematic view of a first possible embodiment of a washing unit 100 according to the invention, which allows the operation thereof to be understood. Each of the side basins 52A, 52B defines a maximum filling level L1, beyond which the liquid overflows outside the basin itself. The lower basin 51 defines a volume for collecting the liquid that is below the maximum filling level L1. Thus, the liquid that overflows from the side basins 52A, 52B may be collected in the lower basin 51, which instead takes on a middle position, as shown in FIG. 1. The term "middle" means a condition whereby the first reference plane R1 crosses the collection area defined by the lower basin 51. It is worth noting that in reference to the position of the maximum level L1 with respect to the collection volume of the lower basin 51, the side basins 52A, 52B may be considered as upper basins with respect to the vertical arrangement shown in FIG. 3.

The water network 80 comprises two branches 80A, 80B which bring the liquid to a first series of hydraulic terminals 81 close to the first side basin 52A and to a second series of hydraulic terminals 82 close to the second basin 52B. Preferably, each series of hydraulic terminals 81, 82 is arranged so that the liquid outlet hits the washing brush 6A provided for the corresponding side basin 52A, 52B. In any case, the washing liquid supplies the corresponding side basin 52A, 52B for each series of hydraulic terminals 81, 82. Once the maximum filling condition (maximum level L1) is reached, the liquid overflows into the lower basin 51 in which a bath is formed. In the latter, a brush 6 is partially immersed. Thus, the liquid is collected in the lower basin 51 only for overflowing from the side basins 52A, 52B. The installation of a hydraulic branch for supplying the basin itself may therefore be avoided.

Figure 2:
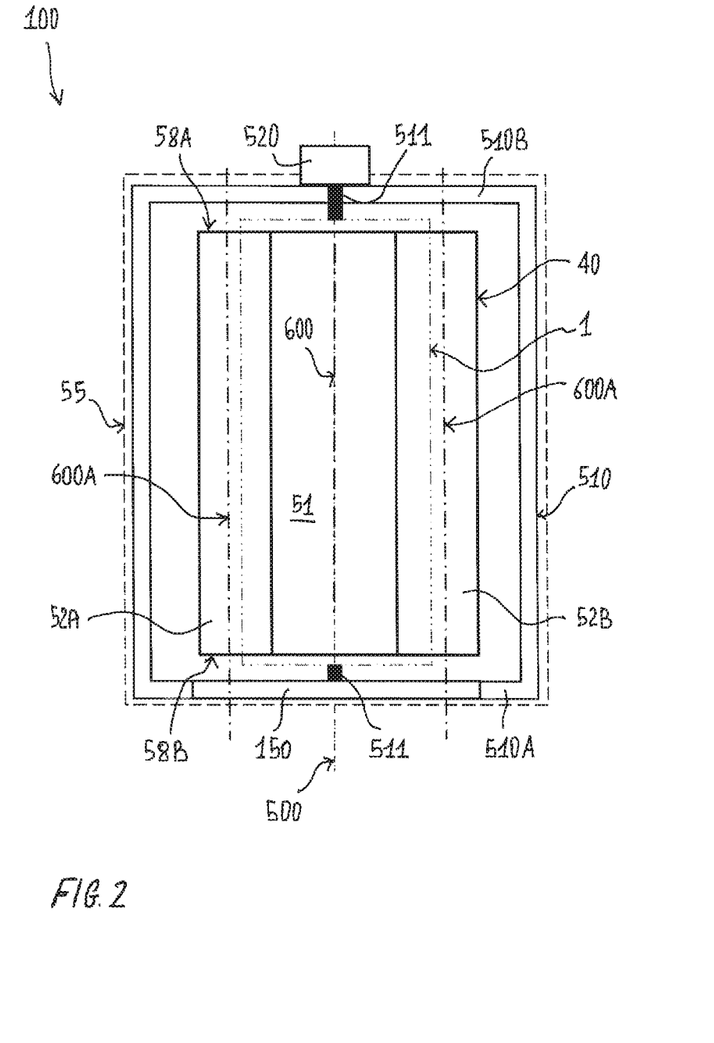
FIG. 2 is a schematic top view of the washing unit in FIG. 1.

FIG. 2 is a schematic top view of the washing unit 100 in which the main cylinder 1 is indicated with a dotted line (dotted line, two dots) to highlight it from the shape of the containment structure 40. In such drawings, there are indicated the rotation axes 600A, 600 of the washing brushes 6, 6A. The latter are not shown for clarity. According to a first aspect, the washing unit 100 comprises a support frame 510 comprising two sides 510A, 510B on which there are mounted supports 511 which carry the main cylinder 1 on opposite sides, thus allowing the rotation thereof about the longitudinal axis 500. Such a rotation is achieved through a motor assembly 520 connected, by means of a mechanical drive, to one end of the main cylinder 1 itself according to any known movement principle.

In a similar manner, each washing brush 6, 6A is carried, at opposite ends, by the sides 510A, 510B of the support frame through suitable supports (not shown) which define the corresponding rotation axis 600, 600A thereof. In this regard, the rotation speed of the rotating brushes 6, 6A may directly depend on the rotation speed of the main cylinder 1. In this case, the main cylinder 1 is mechanically connected to the rotating brushes 6, 6A through a mechanical drive 150 so that a rotation of brushes 6, 6A, 6B corresponds to a rotation of the main cylinder 1. This mechanical drive 150 preferably develops a drive ratio greater than 1 so that brushes 6, 6A rotate faster than the main cylinder 1. Preferably, drive 150 is positioned at one side of the frame 510A opposite to side 510B on which the motor assembly 520 that activates the rotation of the main cylinder 1 is positioned. Alternatively, the rotation of brushes 6, 6A could be independent from the rotation of cylinder 1. Here, the washing unit 100 could be provided with a further motor assembly specifically provided for the rotation of brushes 6, 6A.

Preferably, the rotation of the main cylinder 1 and of the washing brushes 6, 6A is managed by a control unit (hereinafter ECU) which electrically controls the motor assembly(ies) in charge of generating the rotation movement of these components.

With reference again to FIG. 1, the two side basins 52A, 52B preferably have a mirror-like shape with respect to the above-indicated vertical reference plane R1. In substance, they configure liquid collection volumes which are mirror the reference plane R1.

The two side basins 52A, 52B are arranged in a position which is below a second horizontal reference plane R2 which contains the longitudinal axis 500. The two reference planes R1 and R2 are defined considering the main cylinder 1 in the "washing" position, that is the position for which brushes 6, 6A may efficiently brush plate 52, thus promoting the detachment of the non photo-exposed polymer.

Preferably, for each of the side basins 52A, 52B, the related washing brush 6A occupies a mirror-like position (assessed with respect to the reference plane R1) with respect to the one of the brush 6A installed at the other of the side basins 52A, 52B. Moreover, as a result of the arrangement of the side basins 52A, 52B, the rotation axis 600 of brush 6 installed at the lower basin 51 is in a position below a third reference plane R3 identified by the rotation axes 600A of brushes 6A related to the side basins 52A, 52B. As shown, the rotation axis 600 of brush 6 installed at the lower basin 51 lies on the first vertical reference plane R1 on which the longitudinal axis 500 also lies.

According to another aspect, each of the basins 51, 52A, 52B of structure 40 is defined by a plurality of longitudinal walls, that is walls that mainly extend along a direction parallel to the longitudinal axis 500. In particular, the longitudinal walls extend for a length which is greater than or equal to the longitudinal extension of brushes 6, 6A. Each of the basins 51, 52A, 52B of structure 40 is also defined by a pair of transverse walls connected to the corresponding side walls in opposed position.

According to a preferred embodiment, the structure 40 comprises two transverse walls 58A, 58B opposed to each other, which provide a transverse closing surface for each of the basins 51, 52A, 52B of the structure itself. In substance, all the longitudinal walls of the basins 51, 52A, 52B are connected, at opposite ends, to the two transverse walls 58A, 58B. Thereby, as a result of the transverse walls 58A, 58B, the basins 51, 52A, 52B become integral with one another. Structure 40 may thus be made and defined outside chamber 55 and installed therein very quickly. In this regard, structure 40 may easily be made, for example through the welding of metal sheets.

FIG. 1 is a cross section of structure 40 defined according to a sectional plane orthogonal to the longitudinal axis 100. Such a section shows the possible shape and possible arrangement of the longitudinal walls defining structure 40. Unless otherwise indicated, the walls indicated in the description below are intended as "longitudinal walls".

Preferably, the lower basin 51 comprises a bottom wall 71A and two opposed side walls 71B which extend from the bottom wall 71A. Preferably, the shape of the lower basin 51 is symmetrical with respect to the above-indicated vertical reference plane R1. In particular, the cross section substantially is shaped like a downwards "funnel".

Also each of the two side basins 52A, 52B comprises a bottom wall 72A and two opposed side walls 72B, 72C. Preferably, for each of the two side basins 52A, 52B, the corresponding bottom wall 72A is positioned arranged at a height greater than the one of the bottom wall 71A of the lower basin 51.

According to another aspect, for each of the two side basins 52A, 52B, there is provided a first outermost side wall 72B and a second innermost side wall 72C. The terms "outermost" and "innermost" indicate the "furthest" and "closest" position, respectively, to the longitudinal axis 500. The innermost wall 72C vertically is less extended with respect to the outermost wall 72B. Thereby, once the filling condition (maximum level L1) is reached, the washing liquid may overflow only inwards to fall into the lower basin 51.

According to a possible embodiment shown in FIG. 1, for each of the two side basins 52A, 52B, the corresponding bottom wall 72A is connected to a corresponding side wall 71B of the lower basin 51. Moreover, for each of the two side basins 52A, 52B, the innermost wall 72C is connected to a corresponding side wall 71B of the lower basin 51, thus in fact forming an extension thereof. In this regard, the two walls 71B, 72C may be coplanar (as in FIG. 1) or not coplanar. For example, wall 72C could be inclined inwards so as to move the liquid falling point even more inwards (that is towards the vertical plane R1).

Advantageously, the connection between the bottom walls 72A of the side basins 52A, 52B with the side walls 71B of the lower basin 51 makes structure 40 superficially continuous so as to keep the liquid in the structure itself. Preferably, the containment structure 40 has a symmetrical shape with respect to the first reference plane R1. Overall, the cross section of structure 40 has a shape which converges towards the first reference plane R1 at the lower basin 51.

Figure 3:
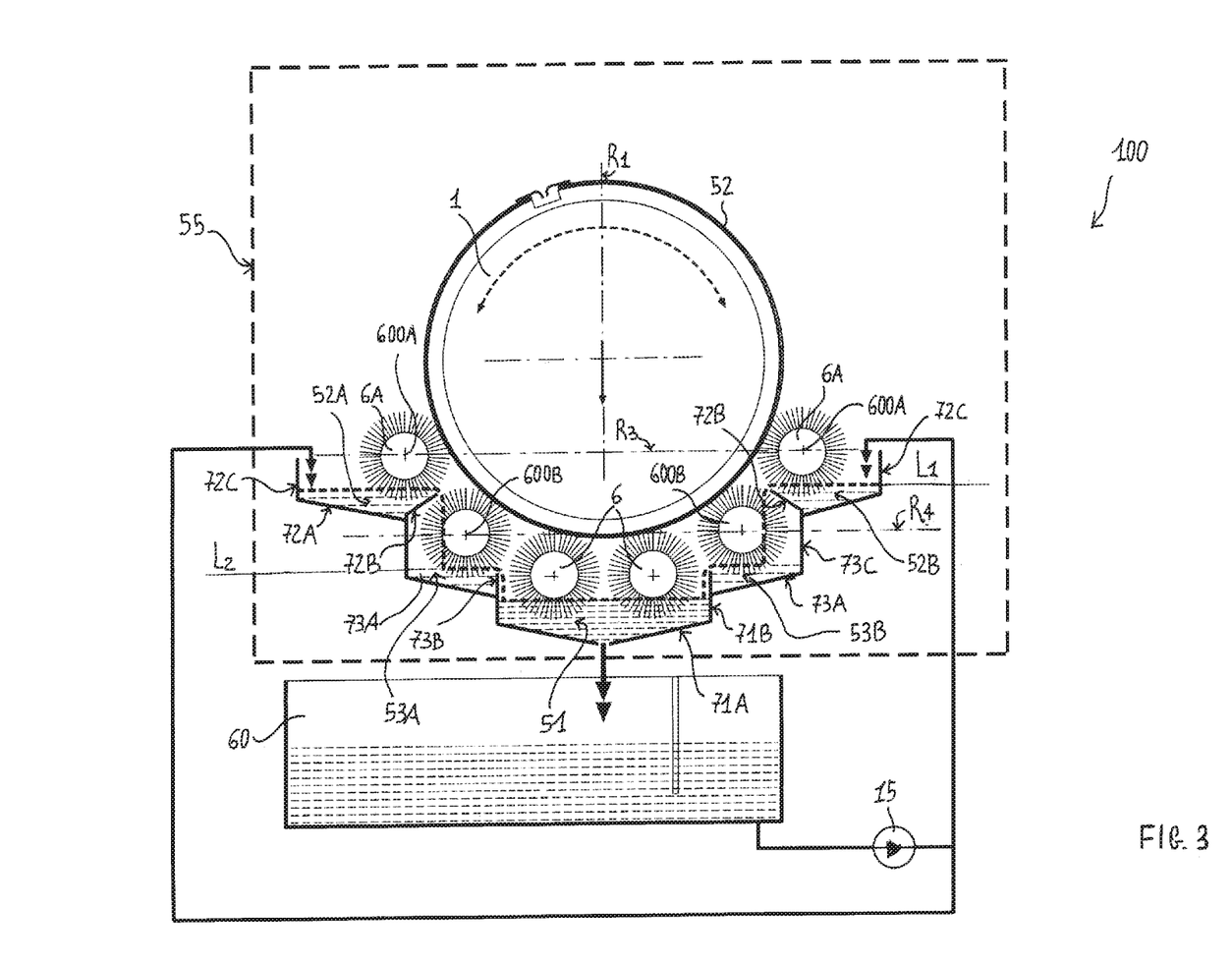
FIG. 3 is a schematic view of a second embodiment of a washing unit according to the present invention.
Figure 4:
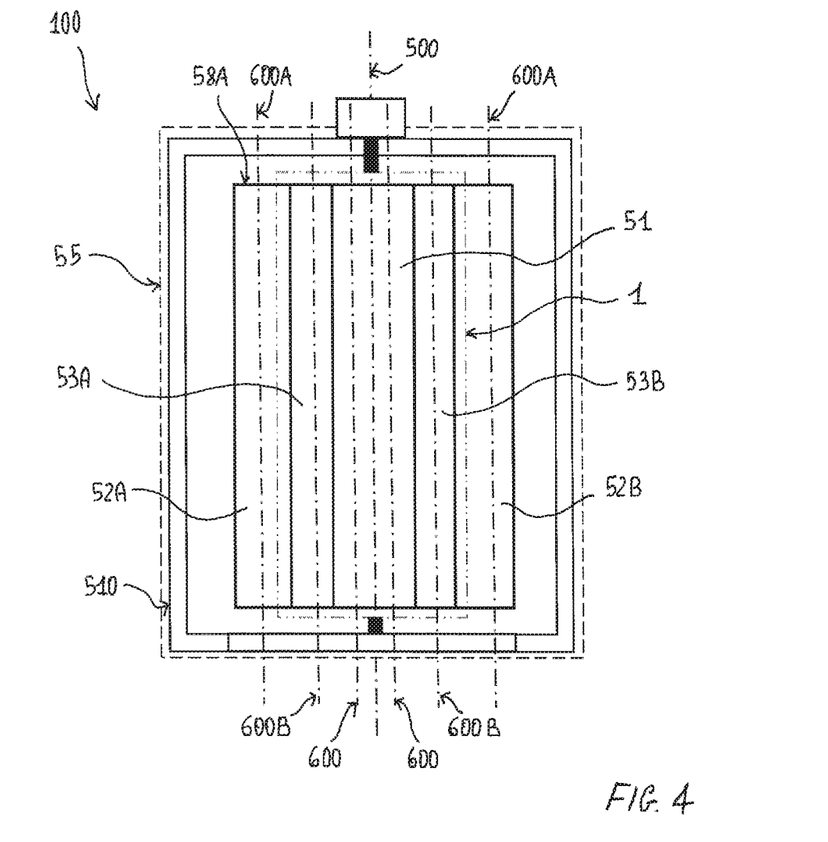
FIG. 4 is a schematic plan view of the washing unit in FIG. 3.

FIGS. 3 and 4 are schematic views related to a second possible embodiment of the invention which is particularly suitable for using water-based liquid. In particular, there is provided a first intermediate basin 53A and a second intermediate basin 53B in this embodiment. Each intermediate basin 53A is interposed between a corresponding side basin 52A, 52B and the lower basin 51 so that when the corresponding side basin 52A, 52B reaches the condition of maximum filling, the liquid which overflows flows into the intermediate basin 52A, 52B, and so that when the intermediate basin 53, 53B reaches the maximum filling condition, the liquid which overflows flows into the lower basin 51.

As shown in the drawings, at each intermediate basin 53A, 53B, there is provided a washing brush 6B which remains partially immersed in the liquid bath defined by the same intermediate basin 53A, 53B. In substance, for each basin 51, 52A, 52B, 53A, 53B of the structure 40, there preferably is provided at least one washing brush 6, 6A, 6B. Advantageously, the greater number of brushes allows the mechanical brushing action to be increased on plate 52. This makes the water-based liquid actually usable and competitive with the solvent-based liquid for washing flexographic plates wound about a support cylinder.

Overall, the two side basins 52A, 52B and the two intermediate basins 53A, 53B configure two cascades (indicated in FIG. 3 with two dotted lines) for the washing liquid in opposite position with respect to the reference plane RE Each liquid cascade extends from a side basin 52A, 52B up to the lower basin 51 passing through the corresponding intermediate basin 53A, 53B. In particular, each of the two intermediate basins 53A, 53B configures a liquid collection volume which identifies a maximum filling level L2 which is above the collection volume defined by the lower basin 51 and below the maximum filling level L1 established for the corresponding side basin 52A, 52B. It is worth noting how the supply of the side basins 52A, 52B is continuous during the washing of plate 52, whereby the washing liquid continuously moves in structure 40 according to the "cascade" principle described.

Preferably, two rotating brushes 6, even more preferably, symmetrical brushes with respect to the first reference plane R1, are installed at the lower basin 51. Overall, in the embodiment in FIGS. 3 and 4, there are provided six washing brushes 6, 6A, 6B in charge of exerting a mechanical action on plate 52 to detach the non photo-exposed polymer or monomer. The six brushes 6, 6A, 6B define a kind of "cradle" which surrounds and comes into contact with a lower portion of the main cylinder 1 when it occupies the above-defined washing position.

As shown in FIG. 3, brushes 6B related to the intermediate basins 53A, 53B preferably are in mirror position with respect to the first vertical reference plane R1. In a similar manner, also the two brushes 6 related to the lower basin 51 preferably are in a mirror position with respect to the same plane. Preferably, overall the cradle of brushes 6, 6A, 6B is symmetrical with respect to the first reference plane R1.

Moreover, it is worth noting that brushes 6B of the intermediate basins are installed in such a position that the rotation axes 600B thereof are on a fourth reference plane R4 comprised between the above-defined third reference plane R3 and the rotation axis 600 of brushes 6 installed at the lower basin 51.

According to further aspect, the first intermediate basin 53A and the second intermediate basin 53B have a shape which is conceptually ascribable to the one of the side basins 52A, 52B which are supplied by the water network 80. In substance, also the intermediate basins 53A, 53B are defined by longitudinal walls and by transverse walls. Also in this case, two opposed transverse walls 58A, 58B are preferably provided, which transversally close all the basins 51, 52A, 52B, 53A, 53B. The structure 40 preferably keeps a symmetrical configuration with respect to the above-defined vertical reference plane R1.

With reference to the view in FIG. 3, it is worth noting that also each intermediate basin 53A, 53B comprises a bottom wall 73A, an innermost side wall 73B and an outermost side wall 73C. The latter is vertically more extended with respect to the innermost side wall 73B, again in order to allow the liquid to overflow inwards (that is towards the lower basin 51).

Preferably, for each intermediate basin 53A, 53B, the bottom wall 73A is positioned at an intermediate height between the one of the bottom wall 71A of the lower basin 51 and the bottom wall 72B of the corresponding side basin 52A, 52B. Even more preferably, for each intermediate basin 53A, 53B, the bottom wall 73A has an inclination which is substantially equal to the one of the bottom wall 72A of the corresponding side basin 52A, 52B.

According to the preferred embodiment shown in FIG. 3, for each intermediate basin 53A, 53B the bottom wall 73A, is connected to a side wall 71B of the lower basin 51. In particular, the bottom wall 73A extends outwards. At the same time, the bottom wall 72A of the corresponding side basin 52A, 52B extends (outwards) from the outermost side wall 73C. Moreover, for each intermediate basin 53A, 53B, the innermost side wall 73B extends from the corresponding side wall 71B of the lower basin 51.

Again with reference to FIG. 3, the collection volume of each intermediate basin 53A, 53B occupies a position below and closer to the first reference plane R1 with respect to the one of the volume defined by the corresponding side basin 52A, 52B. Overall, also in the embodiment in FIG. 3, structure 40 has a symmetrical shape with respect to the first reference plane R1 and converging towards the same plane at the lower basin 51.

According to another aspect, for each side basin 52A, 52B, the innermost side wall 72B, is connected to the outermost side wall 73C of the corresponding intermediate basin 53A, 53B, thus in substance forming an extension thereof. Preferably, the innermost side wall 72B is inclined inwards on a plane which is interposed between two brushes 6A, 6B arranged at different heights. Thereby, during the washing of plate 52, the liquid which overflows from the side basin 52A, 52B advantageously falls onto the brush partially immersed in the corresponding intermediate basin 53A, 53B to the advantage of an improved delivery of the washing liquid on the plate to be processed.

Figure 5:
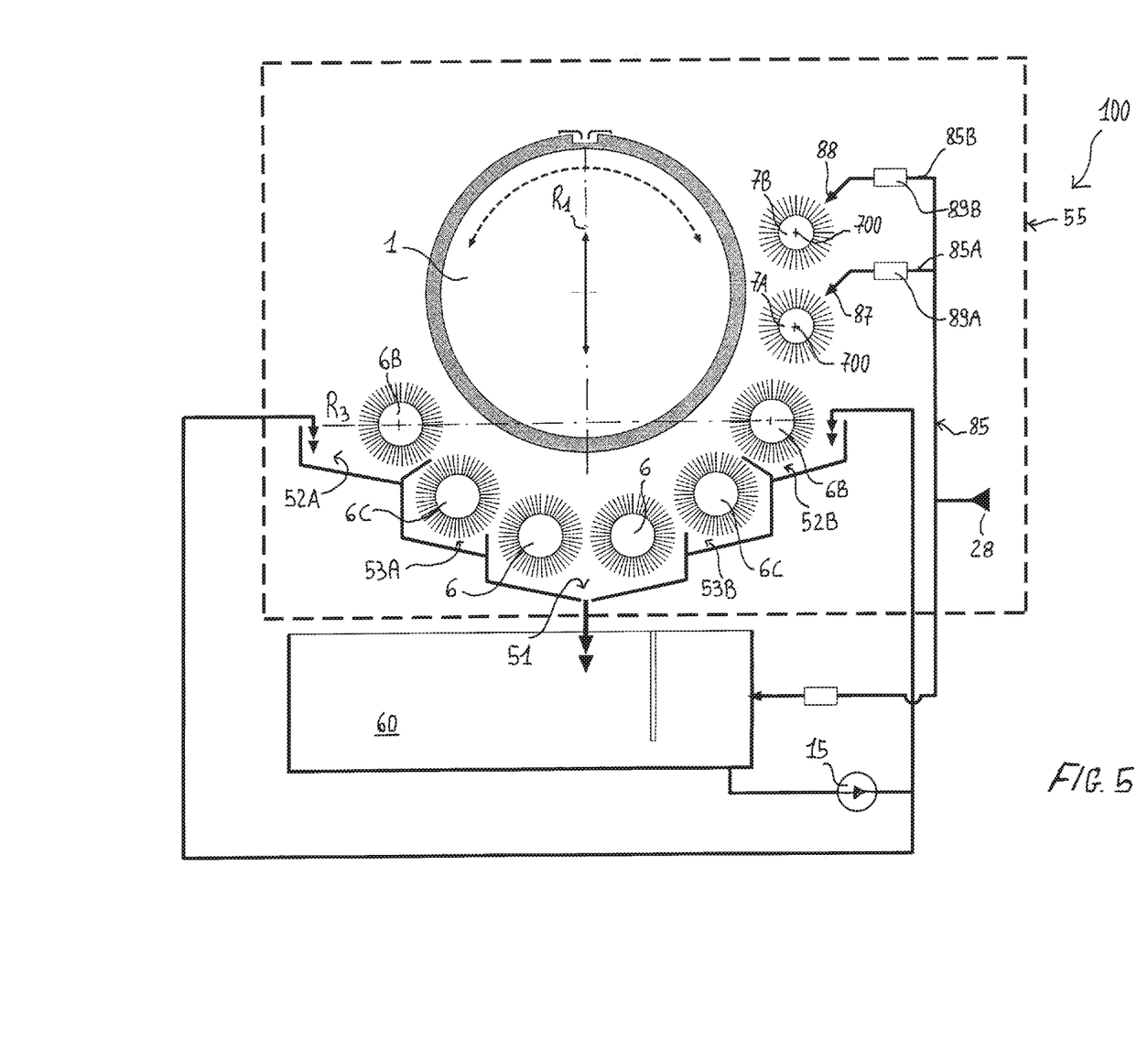
FIG. 5 is a diagrammatic view of a third embodiment of a washing unit according to the present invention.

FIG. 5 is a schematic view of a further possible embodiment of a washing unit 100 according to the invention. The containment structure 40 and the brush assembly 6, 6A, 6B exactly correspond to the ones described with reference to FIGS. 3 and 4. In this embodiment, the washing unit 100 is provided with a first operating assembly 90 for the post-washing treatment of plate 52. In particular, the first operating assembly 90 at least rinses and pre-dries plate 52 when brushes 6, 6A, 6B are deactivated. For this purpose, the first assembly 90 comprises at least a first rinsing brush 7A and at least a second pre-drying brush 7B. The two brushes 7A, 7B rotate about corresponding rotation axes 700 which are parallel to the longitudinal axis 500 of the main cylinder 1.

Preferably, the two brushes 7A, 7B of the first operating assembly 90 are positioned on the same side with respect to the vertical reference plane R1. In any case, the two brushes 7A, 7B are positioned above the above-indicated reference plane R3. Thereby, the two brushes 7A, 7B of assembly 90 do not interfere in any manner with the washing brushes.

According to another aspect, the two brushes 7A, 7B are movable between a non-intervention position, in which they do not come into contact with plate 52, and an intervention position, in which they exert their function. In this regard, the washing unit 100 comprises first movement means and second movement means for moving the first brush 7A and the second brush 7B, respectively, between the two positions indicated (intervention and non-intervention). Preferably, the first and the second movement means are electrically connected to the ECU which controls the activation and deactivation thereof.

Again with reference to FIG. 5, there is provided a hydraulic supply line 85 connected to a source 28 of running water. Such a hydraulic line 85 comprises at least two branches 85A, 85B, each to allow the running water to reach hydraulic terminals 87, 88 arranged at one of the two brushes 7A, 7B of the first operating assembly 90. Preferably, there is provided a shut-off valve 89A, 89B along each branch 85A, 85B, which shut-off valve in an open condition allows the running water to reach one or more corresponding hydraulic terminals 88, 87.

A first hydraulic branch 85A comprising a first valve 89A serves the function of bringing water to the first brush 7A. In particular, such a first valve 89A is opened when the first brush 7A occupies the intervention position and when the same brush rotates. Practically, valve 89A is opened when the first brush 7A actively acts on the surface of plate 52.

A second hydraulic branch 85B, comprising a second valve 89B, instead is provided to bring water to the second brush 7B. In this case, the second valve 89B is opened for a predetermined time when the second brush 7B occupies the non-intervention position. Indeed, in the case of the second brush 7B, the water is used to clean it at the end of the use thereof. Specifically, the second brush 7B is brought back to the non-intervention position and brought into rotation for a given time, thus keeping valve 89B open. At the end of washing, valve 89B is closed.

Figure 7:
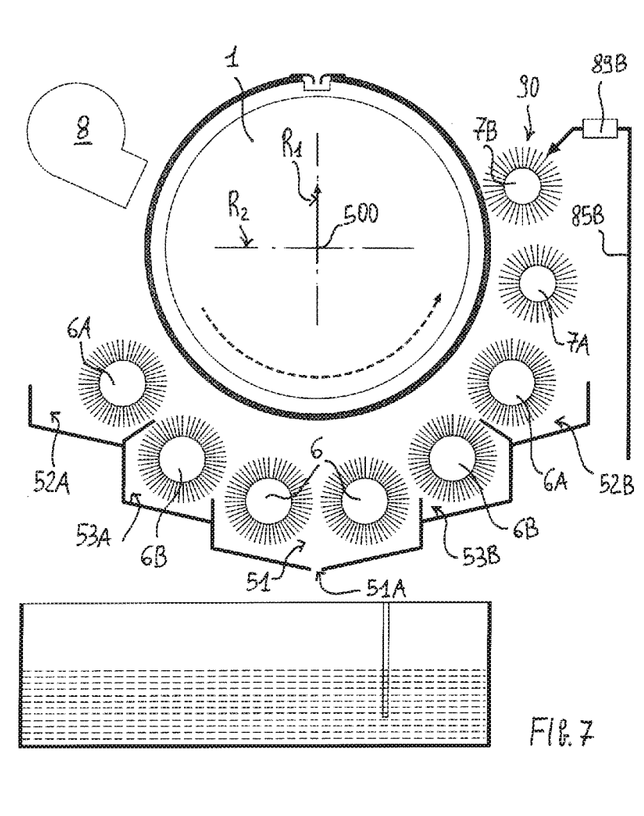

According to a preferred embodiment shown in FIG. 7, the assembly 90 preferably also comprises an air dryer 8 which acts in conjunction with the second brush 7B to dry the plate 52. In particular, dryer 8 is configured to generate an air knife which hits the surface of plate 52, while the same rotates together with said main cylinder 1. Namely, such an air knife extends for the whole longitudinal length of the main cylinder 1.

Preferably, the dryer 8 is operatively arranged on a side opposite to the one on which the second brush 7B is positioned with respect to the above-defined vertical reference plane R1. In this regard, the second brush 7B therefore serves the function of mechanically removing the water on the surface of plate 52 following the rinsing step actuated by the first brush 7A. The air knife generated by dryer 8 instead actually performs the drying, making plate 52 ready for the successive use.

Advantageously, the drying of plate 52 occurs inside the same unit in which the washing occurs. Thereby, there is no need to prepare an operating unit dedicated only to drying the plates. This is to the advantage of an overall reduction of the plant costs.

According to another preferred aspect of the present invention, which is valid for all embodiments, the main cylinder 1 is movable between at least a washing position and at least a neutral position. In the washing position, the main cylinder 1 rests against the cradle of washing brushes 6, 6A, 6B so that they may exert their action on plate 52. Contrarily, in the neutral position, the main cylinder 1 is raised and spaced apart from the washing brushes 6, 6A, 6B so as to avoid contact with them. FIG. 3 shows the main cylinder 1 in the washing position, while FIG. 5 shows it in the neutral position.

The washing unit 100 comprises suitable lifting means (not shown in the drawings) in order to reversibly move the main cylinder 1 between the washing position and the neutral position. Preferably, also such lifting means are electrically connected to the control unit ECU.

The lifting means preferably are configured to bring the main cylinder 1 also into a service position in which the same is even further raised with respect to brushes 6, 6A, 6B than it is in the neutral position. Such a service position allows the operators to inspect or intervene on the washing brushes 6, 6A, 6B (for example, to remove or replace them) and/or to perform maintenance/cleaning operations of the containment structure 40.

With reference to the embodiment in FIG. 5, the main cylinder 1 is then raised into the neutral position at the end of the washing step. Preferably, once this position is reached, the post-washing treatment (rinsing, pre-drying and drying) of plate 52 is actuated. In this regard, the washing unit 100 comprises suitable sensor means connected to the unit ECU to recognize the position occupied by the main cylinder 1.

Figure 6:
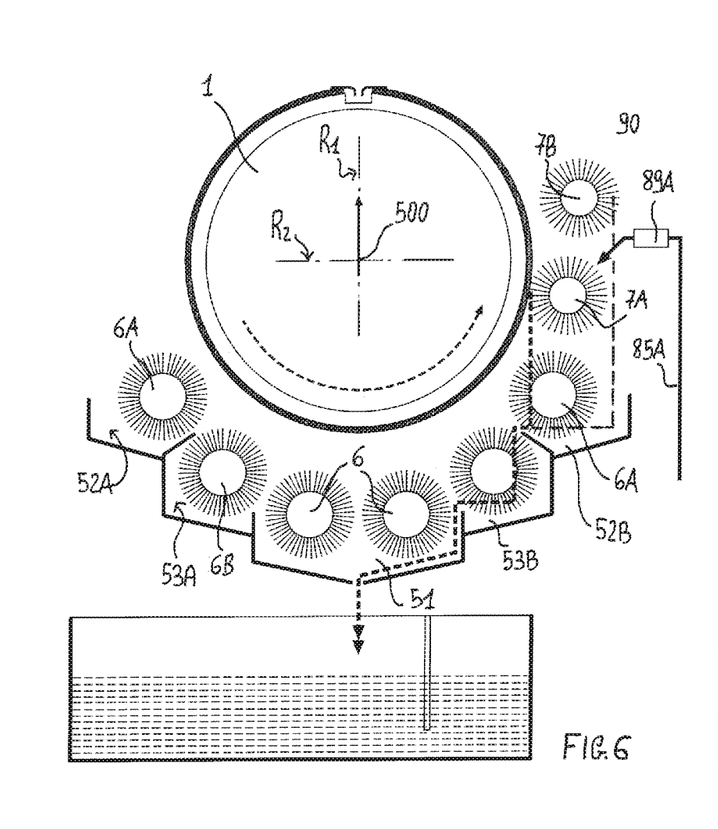
FIGS. 6 and 7 are schematic views of the washing unit in FIG. 5, each related to an operating step of the unit itself.

FIG. 6 refers to the rinsing step, in which the first brush 7A is brought into the intervention position through the first movement means. In this condition, valve 89A is opened and water starts being outlet at brush 7A. The main cylinder 1 and brush 7A are put into rotation, preferably with discordant directions of rotation. As indicated by the dotted line in FIG. 6, the water used in the washing advantageously falls into structure 40 and follows the same cascade path up to the lower basin 51. At the end of the rinsing, the first brush 7A is brought back to the non-intervention position.

FIG. 7 instead refers to the other post-washing treatment step. The second brush 7B is brought into the intervention position by the second movement means. Once such a position is reached, the main cylinder 1 and brush 7B are rotated, preferably in discordant manner. Simultaneously, dryer 8 preferably is also activated. This last step of the treatment is performed for a predetermined time interval at the end of which the dryer 8 is deactivated and the brush 7B is brought back into the non-intervention position shown in FIG. 6.

The cleaning of the second brush 7B (by means of the rotation of it and the opening of valve 89B) may be performed when the treated plate 52 has been brought out of chamber 55. Moreover, such a cleaning may be performed after the treatment of a plate or after treating a given number of plates. Advantageously, also the water used for washing brush 7B is collected in the containment structure 40 (see again FIG. 6).

As already indicated above, the washing unit 100 also may be used for washing plates 52. In this case, the washing unit 100 is provided with a second operating unit 95 which automatically allows loading/unloading plate 52 onto/from the main cylinder 1. Within the context of the present invention, the term "loading" means the operation of causing plate 52 to firmly adhere about the surface of the main cylinder 1. The term "unloading" instead means the operation of removing plate 52 from the main cylinder 1.

With reference to FIGS. 8 to 13, the second operating assembly 95 comprises suction bodies 96 susceptible to attaching to a surface 52E of the plate 52 following the application of the vacuum between the suction body 96 and the surface itself, according to a principle which in itself is known. The suction bodies 96 serve the function of guiding plate 52 between an inlet section 55A of chamber 55 (indicated only in FIG. 8) and a first reference position, upon the reaching of which a first edge portion 52A of the plate firmly connects to the surface of the main cylinder 1.

For this purpose, the main cylinder 1 is provided with a pair of grippers 4A, 4B. Each gripper 4A, 4B is intended to grasp an edge portion 52A, 52B of the plate 52 which is opposed to an edge portion that is grasped by the other gripper. The two grippers 4A, 4B are positioned in a seat 1B which extends for the whole longitudinal extension of the main cylinder 1. In this regard, the diameter and the circumference of the main cylinder 1 are established according to the length of plate 52.

Preferably, the two grippers 4A, 4B are positioned in the same seat 1B. In a possible embodiment (not shown), there could be a further seat in which a further gripper is positioned. Thereby, plates 52 which have at least two different lengths may adhere about the main cylinder 1, to the advantage of the functional versatility of the washing unit 100.

Moreover, the second operating assembly 95 further comprises a pressure cylinder 44 which is movable between an operating position and a neutral position. In the operating position, cylinder 44 presses plate 52 against the surface of the main cylinder 1. In the neutral position, such a cylinder 44 does not intervene in any manner on plate 52. Cylinder 44 has a longitudinal extension which is greater than or equal to the one of the main cylinder 1. Preferably, it is positioned on the side opposite (with respect to the vertical reference plane R1) to the one on which the inlet section 55A of chamber 44 is defined.

Preferably, the pressure cylinder 44 is moved between the two positions indicated (operating and neutral) through movement means (not shown) controlled by the ECU. Likewise, there are also provided means for closing/opening the grippers 4A, 4B (also not shown), the activation/deactivation of which preferably occurs through the same ECU.

Figure 8:
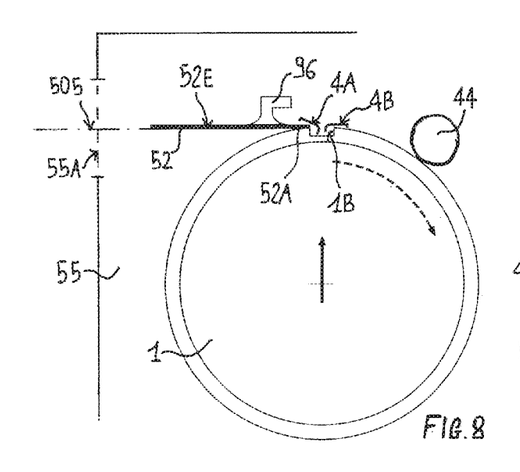
FIGS. 8 to 13 are schematic views related to the operation of an operating unit of a washing unit according to the present invention.
Figure 9:
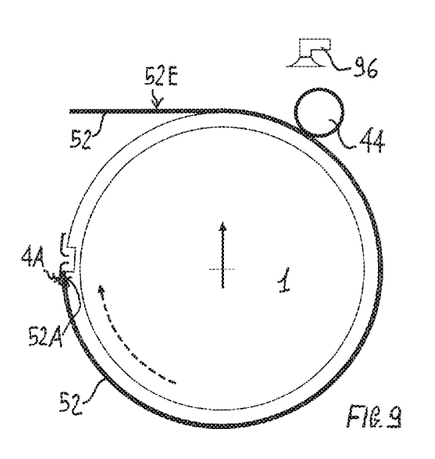
Figure 10:
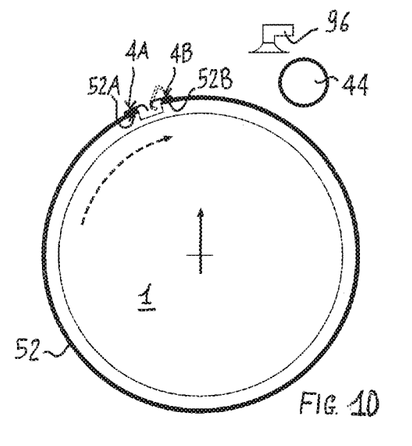

With reference to FIGS. 8 to 10, below there is described the operation of the second operating assembly 95 in relation to the loading step of plate 52. With reference to FIG. 8, the main cylinder 1 occupies the neutral position. The pressure cylinder 44 is brought against the main cylinder 1. At this point, the suction means 96 pick plate 52 and move it along a movement plane 505 which is tangent to the main cylinder 1 at seat 1B in which the two grippers 4A, 4B are positioned. In particular, the suction means bring plate 52 up to a blocking position which when reached, allows the first edge 52A of plate 52 to be gripped by a first gripper 4A. Once the blocking position is reached, the first gripper 4A is activated (that is closed) so as to block said first edge 52A against the surface of the main cylinder 1. Upon such a blocking, the suction means 96 are deactivated and brought to a neutral position.

At this point, the main cylinder 1 is rotated in a direction which allows the plate to be wound about the cylinder. In FIG. 9, the direction is clockwise because the inlet section 55A is defined on the left side. During the rotation of the main cylinder 1, the cylinder 44 stays in the operating position. Rotation is concluded when plate 52 is completely wound onto the surface of the cylinder (see FIG. 10). In this condition, the second edge 52B is blocked by the second gripper 4B once it is activated. At the same time, the pressure cylinder 44 is brought back to the neutral position, as shown in FIG. 10.

Figure 11:
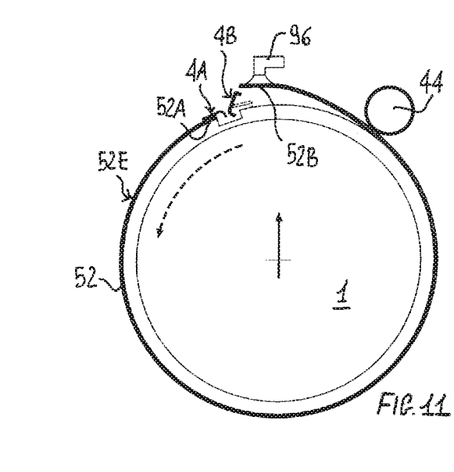
Figure 12:
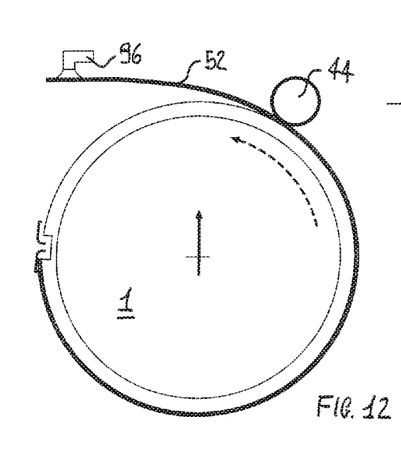
Figure 13:
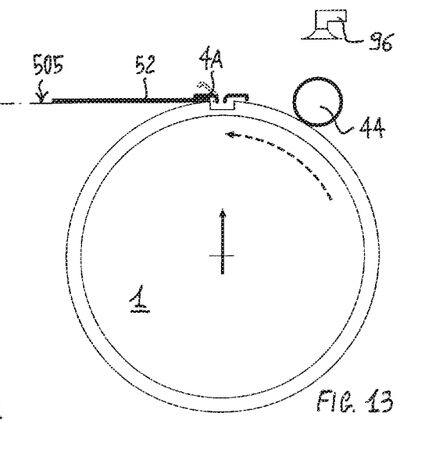

With reference to FIGS. 11 to 13, below is described the operation of the second operating assembly 95 in relation to the unloading step of plate 52. The suction means 96 are activated and move from the neutral position up to attaching to the outer surface 52E of plate 52 close to the second edge portion 52B gripped by the second gripper 4B. At the same time, cylinder 44 is brought to the operating position (FIG. 11).

Once these conditions have been reached, the second gripper 4B is deactivated (opened) and immediately after, the main cylinder 1 is rotated in a direction opposite to the one followed during the loading step (anticlockwise in FIGS. 11 to 13). Such a rotation induces the gradual detachment of plate 52 from the surface of the main cylinder 1 (see FIG. 12). This detachment is guided by the suction means 96 which drag plate 52 towards the inlet section 55A of chamber 55 to gradually reposition it on the movement plane 505. With reference to FIG. 13, when plate 52 is relocated on the movement plane 505, the first gripper 4A is deactivated so as to also free the first edge 52A. Thereby, plate 52 may be extracted from the washing unit 100.

According to an alternative embodiment not shown in the drawings, the washing unit 100 could comprise a section for inserting the plate and a section for removing the same at the end of the washing and post-washing treatment. The two sections could be opposed with respect to the vertical reference plane R1. In this hypothesis, in the unloading step, the main cylinder 1 would rotate in the same direction followed in the loading step. At the same time, the suction means 96 would guide the plate towards the extraction section following the deactivation of the first gripper 4A, i.e. the detachment of the first edge 52A.

In substance, the operation of the operating assembly 95 may be adapted to the various needs. In this regard, if the washing unit 100 is used as autonomous unit, then the insertion and extraction may be performed on the same side (through the same section). Contrarily, if the washing unit 100 is used in an in-line plant, then for an insertion and an extraction actuated on opposite sides are preferred.

The above-described solutions allow the preset tasks and objects to be completely absolved. In particular, the washing unit according to the invention is highly versatile since it may be used both for washing with water-based liquid and washing with solvent-based liquid. Simultaneously, the washing unit may process flexographic plates of the sleeve type or flat flexographic plates. Such a versatility is caused by the containment structure which allows a controlled delivery of the washing liquid in the chamber in which the main cylinder carrying the flexographic plate is located. Advantageously, the containment structure allows the water supply network provided for bringing the washing liquid into the chamber to be significantly simplified.

The invention claimed is:

1. A washing unit for washing a flexographic plate, wherein said unit comprises:
  a chamber in which of said plate the washing occurs;
  a main cylinder around which said plate may be wound, said main cylinder being positioned in said chamber and rotating about a longitudinal axis;
  an assembly of washing brushes, each of which rotates about a rotation axis which is substantially parallel to said longitudinal axis;
  a water supply network for bringing washing liquid into said chamber,
  characterized in that it comprises a liquid containment structure positioned in said chamber, wherein said structure comprises:
    a lower basin arranged in a position below said main cylinder, said basin defining a discharge section of said liquid;
    at least a first side basin and at least a second side basin arranged on opposite sides with respect to a first vertical reference plane containing said longitudinal axis of rotation, each of said side basins being supplied with washing liquid through said water network,
  wherein with respect to the lower basin, said side basins are arranged so that following the filling thereof, said washing liquid directly or indirectly overflows, flowing into said lower basin, and
  wherein there is installed a washing brush at each of said basins of said structure so that the same brush is partially immersed in the liquid collected in the corresponding of said basins.

2. The unit according to claim 1, wherein said side basins are in a mirror position with respect to said first reference plane.

3. The unit according to claim 2, wherein, for each of said side basins, said at least one washing brush occupies a mirror position with respect to said first reference plane, with respect to the position occupied by the washing brush installed at the other of said side basins.

4. The unit according to claim 1, wherein said basins of said structure comprise a plurality of longitudinal walls which mainly extend along a direction parallel to said longitudinal axis, and wherein said structure comprises two transverse walls opposed to each other which provide a transverse closing surface for each of said basins.

5. The unit according to claim 1, wherein said lower basin comprises a bottom wall and two opposed side walls which extend from the bottom wall, said walls of said lower basin extending mainly along a direction parallel to said longitudinal axis.

6. The unit according to claim 5, wherein each of the two side basins comprises a bottom wall arranged at a height greater than the one of the bottom wall of the lower basin, each of said side basins comprising a first outermost side wall and a second innermost side wall, which is vertically less extended with respect to said outermost side wall.

7. The unit according to claim 6, wherein, for each of said side basins, the corresponding bottom wall is connected to a corresponding side wall of the lower basin 51, and wherein, for each of the two side basins, the innermost side wall is connected to a corresponding side wall of the lower basin 51, thus forming an extension thereof.

8. The unit according to claim 1, wherein said containment structure comprises a first intermediate basin and a second intermediate basin, each intermediate basin being interposed between a corresponding side basin and said lower basin so that once the filling condition is reached for said corresponding side basin, the overflowing liquid flows into the intermediate basin and so that once the filling condition is reached for said intermediate basin, the liquid overflows therefrom, flowing into said lower basin.

9. The unit according to claim 8, wherein a washing brush is installed at each intermediate basin, which brush remains partially immersed in the liquid bath defined by the same intermediate basin.

10. The unit according to claim 8, wherein the first intermediate basin and the second intermediate basin are in a mirror position with respect to said first reference plane, and/or wherein said first side basin and said second side basin are in a mirror position with respect to said first reference plane.

11. The unit according to claim 8, wherein each of said intermediate basins comprises a bottom wall, an innermost side wall and an outermost side wall which is vertically more extended with respect to said innermost side wall, and wherein said bottom wall is positioned at an intermediate height between the one of said bottom wall of said lower basin and said bottom wall of a corresponding one of said side basins.

12. The unit according to claim 11, wherein for each of said intermediate basins:
  said bottom wall is connected, towards the outside, to a side wall of said lower basin;
  said bottom wall of a corresponding one of said side basins extends, towards the outside, from said outermost side wall, and
  said innermost side wall extends from a corresponding side wall of said lower basin.

13. The unit according to claim 1, wherein said unit comprises a first operating assembly for the post-washing treatment of the plate, said first operating assembly comprising at least a first rinsing brush and at least a second pre-drying brush, said brushes being movable between an intervention position on said plate and a non-intervention position, said brushes rotating about corresponding rotation axes which are parallel to said longitudinal axis.

14. The unit according to claim 13, wherein said first operating assembly also comprises a dryer configured to generate an air knife which hits the surface of the plate, while the same rotates together with said main cylinder.

15. The unit according to claim 1, wherein said main cylinder is movable at least between a washing position, wherein said brushes intervene on the surface of said plate, and a neutral position, whereby said washing brushes do not come into contact with the surface of said plate.

* * * * *